(12) United States Patent
Dong et al.

(10) Patent No.: US 11,622,491 B2
(45) Date of Patent: Apr. 4, 2023

(54) ELECTRIC CONTROLLED BI-DIRECTIONAL BENDING ACTUATOR WITH DEFORMABILITY AND STIFFNESS TUNABLE CAPACITY

(71) Applicant: DALIAN UNIVERSITY OF TECHNOLOGY, Liaoning (CN)

(72) Inventors: Xufeng Dong, Liaoning (CN); Bo Li, Liaoning (CN); Ning Ma, Liaoning (CN)

(73) Assignee: DALIAN UNIVERSITY OF TECHNOLOGY, Liaoning (CN)

( * ) Notice: Subject to any disclaimer, the term of this patent is extended or adjusted under 35 U.S.C. 154(b) by 407 days.

(21) Appl. No.: 17/052,983

(22) PCT Filed: Mar. 6, 2020

(86) PCT No.: PCT/CN2020/078133
§ 371 (c)(1),
(2) Date: Nov. 4, 2020

(87) PCT Pub. No.: WO2021/047155
PCT Pub. Date: Mar. 18, 2021

(65) Prior Publication Data
US 2021/0376221 A1    Dec. 2, 2021

(30) Foreign Application Priority Data
Sep. 10, 2019    (CN) .......................... 201910853199.5

(51) Int. Cl.
*H01L 41/08*    (2006.01)
*H01L 41/193*   (2006.01)

(52) U.S. Cl.
CPC ......... *H10N 30/2046* (2023.02); *H10N 30/50* (2023.02); *H10N 30/878* (2023.02); *H10N 30/88* (2023.02)

(58) Field of Classification Search
CPC .. H10N 30/2046; H10N 30/50; H10N 30/878; H10N 30/88; H01L 41/193;
(Continued)

(56) References Cited

U.S. PATENT DOCUMENTS
2005/0200238 A1    9/2005    Park et al.

FOREIGN PATENT DOCUMENTS
CN    104900798 A    9/2005
CN    109571453 A    4/2019
(Continued)

*Primary Examiner* — Derek J Rosenau
(74) *Attorney, Agent, or Firm* — Muncy, Geissler, Olds & Lowe, P.C.

(57) ABSTRACT

An electric controlled bi-directional bending actuator with deformability and stiffness tunable capacity is disclosed. The electric controlled bi-directional bending actuator with deformability and stiffness tunable capacity comprises three kinds of functional layers that are electro-deformable layers, electro-variable stiffness layers and flexible electrodes. From up to bottom, they are the first flexible electrodes layer, the first electro-deformable layer, the second flexible electrodes layer, the electro-variable stiffness layer, the third flexible electrode layer, the second electro-deformable layer and the fourth flexible electrode layer. The adjacent layers are glued together. The electro-deformable layer is made from dielectric elastomers. The electro-variable stiffness layer is made from electro-rheological materials, including electro-rheological fluids, electro-rheological gels or electro-rheological elastomers. Compared with the present pneumatic actuators with deformability and stiffness tunable capacity, the invention has such merits as simple structure, precise regulation, quick response, convenient control and insensitive to environmental.

2 Claims, 2 Drawing Sheets

(58) Field of Classification Search
CPC ............. H01L 41/0926; H01L 41/0966; H01L 41/083; H01L 41/053; H01L 41/0478; H02N 2/0015
See application file for complete search history.

(56) References Cited

FOREIGN PATENT DOCUMENTS

| | | |
|---|---|---|
| CN | 110576447 A | 12/2019 |
| KR | 20180105062 A | 9/2018 |

ELECTRIC CONTROLLED BI-DIRECTIONAL BENDING ACTUATOR WITH DEFORMABILITY AND STIFFNESS TUNABLE CAPACITY

TECHNICAL FIELD

The present invention belongs to the technical field of soft robots. It specifically relates to an Electric controlled bi-directional bending driver with deformability and stiffness tunable capacity.

BACKGROUND

Soft robot is a new field that is still in the ascendant. It focuses on the mechanical properties of soft machine and the integration technology of materials, structures and software. In recent years, a variety of soft robots with deformation adaptation have been proposed. Although some of them have been crowned with success, most of them mainly paid attention on the research of deformable materials and structures and the realization of the deformation, and few of them study the functional docking after deformation. In practical application, the robot should be a rigid-flexible robot, which not only can deform, but also can maintain the shape to execute some mechanical operations. Flexibility makes the robot adaptable, sensitive and agile, while rigidity ensures that it has the necessary stiffness to execute the operation task.

To address this issue, scholars around the world have developed several driver with deformability and stiffness tunable capacity. However, all of them used pneumatic control mode. For example, Shepherd in Massachusetts Institute of Technology combined Ecoflex and PDMS to invent two stiffness tunable pneumatic actuators with different structures. Furthermore, they combined porous PDMS with low-melting alloy foam to develop a temperature/air dual-drive deformable and stiffness variable actuator with shape memory effect and self-healing capacity. Chen in the University of Hong Kong set up a particle-filled cavity in the pneumatic driver, which can adjust the stiffness of the driver based on the blocking effect of particles driven by negative pressure. All of the above mentioned pneumatic actuators required complex mechanical structure pipes, valves and huge air pump load, which greatly limits them from wide applications. Thus, it is urgent to develop a novel deformable and stiffness tunable driver that is driven by the other physical quantity rather than air. As we all know, electricity is a universal physical quantity, which transmit fast, restrict less by environments, and suitable for all the electromechanical system. The technology of electric drive deformation and variable stiffness is undoubtedly subversive, innovative and universal.

Dielectric elastomer is a typical electric driven deformable material. The surface of the dielectric elastomer film is covered by a flexible electrode. By applying an electric field through the flexible electrodes on the dielectric elastomer, it shrinks along the direction of the voltage and stretches perpendicular to the direction. Compared with other large deformable materials, dielectric elastomers have such advantages as fast response, large deformation, low density, high flexibility, high energy density, and are not affected by environmental factors. Therefore, they are widely concerned.

Electrorheological materials are a type of smart materials whose viscosity or elastic modulus can be controlled by the electric field in real time, reversible and quickly, and have the characteristics of electric field tunable damping or stiffness. Electrorheological materials have gone through the development from electrorheological fluid to electrorheological glue and to electrorheological elastomer. Electrorheological fluids are usually prepared by dispersing micron-scale or nano-scale dielectric particles in insulating oil, while electrorheological elastomers are solidified elastomer-based composites that prepared by adding solid particles that can be polarized under an electric field into elastomers. During the solidification process, the solid particles subjected to the electric field gradually form a fibrous or columnar ordered structure. After curing, the ordered structure is embedded in the matrix. As a result, the mechanical properties such as the elastic modulus and damping loss factor of the electrorheological elastomer can be controlled in real time, reversibly and quickly by tuning the electric field.

In summary, scholars around the world have developed a series of actuators with large deformation capacity, but how to maintain the deformed shape to execute the required mechanical operations is the difficulty that restrict the wide applications of those actuators. One promising way to solve this problem is to invent an electric controlled actuator with deformability and stiffness tunable capacity, which is directly driven by electric field, and organically combines the electro-induced deformation materials and electro-driven stiffness tunable materials.

SUMMARY OF THE INVENTION

The purpose of the present invention is to provide an electric controlled bi-directional bending actuator with deformability and stiffness tunable capacity. It would overcome the defects of the prior art, especially overcome the shortcomings of present pneumatic actuators with deformability and stiffness tunable capacity, such as complex structure, slow response, poor control accuracy and so on.

The electric controlled bi-directional bending actuator with deformability and stiffness tunable capacity comprises two layers of electro-deformable layers, one layer of electro-variable stiffness layers and four layers of flexible electrodes. The electro-deformable layer is made from dielectric elastomers, and the electro-variable stiffness layer is made from electrorheological materials. The electro-deformable layer, the flexible electrode and the electro-variable stiffness layer form a laminated structure. When deformation is required, an electric field is applied to the electro-deformable layer through the flexible electrodes; when maintaining shape or providing stiffness is required, an electric field is applied to the electro-variable stiffness layer. By this way, the actuator can realize bi-directional bend, and have the dual function of deformation and tunable by applying electric field.

TECHNICAL SOLUTION OF THE INVENTION

The electric controlled bi-directional bending actuator with deformability and stiffness tunable capacity comprises electro-deformable layers, electro-variable stiffness layers and flexible electrodes.

The electric controlled bi-directional bending actuator with deformability and stiffness tunable capacity has seven layers; from up to bottom, they are first flexible electrodes layer 1, first electro-deformable layer 2, second flexible electrodes layer 3, an electro-variable stiffness layer 4, third flexible electrode layer 5, the second electro-deformable layer 6 and the fourth flexible electrode layer 7. The adjacent layers are glued together.

The first flexible electrode layer 1, the second flexible electrode layer 3, the third flexible electrode layer 5 and the fourth flexible electrode layer 7 are made of coating carbon paste, conductive polymer, conductive hydrogel or conductive silver paste;

The first electro-deformable layer 2 and the second electro-deformable layer 6 are made of dielectric elastomers.

The electro-variable stiffness layer 4 is made of electro-rheological fluids, electro-rheological gels or electro-rheological elastomers. The electrorheological fluids is a mixture of nano-sized dielectric particles and insulating oils, and the volume ratio of the former to the later is 1:9~3:2. The electrorheological gels is a mixture of nano-sized dielectric particles and hydrogels, and the volume ratio of the former to the later is 1:9~3:2. The electrorheological elastomer is a mixture of nano-sized dielectric particles and rubber, and the volume ratio of the former to the later is 1:9~3:2.

When an electric field is applied between the first flexible electrode layer 1 and the second flexible electrode layer 3, the first electro-deformable layer 2 will deform due to the Maxwell effect, leading the actuator bends to one side. Meanwhile, since no electric field is applied between the second flexible electrode layer 3 and the third flexible electrode layer 5, and between the third flexible electrode layer 5 and the fourth flexible electrode layer 7, the electro-variable stiffness layer 4 and the second electro-deformable layer 6 deform synergistically with the first electro-deformable layer 2. Subsequently, by applying an electric field between the second flexible electrode layer 3 and the third flexible electrode layer 5, the electro-variable stiffness layer 4 become more rigid. As a result, the actuator maintain a stable deformed state.

On the contrary, when an electric field is applied between the third flexible electrode layer 5 and the fourth flexible electrode layer 7, the second electro-deformable layer 6 will deform due to the Maxwell effect, leading the actuator bends to another side. Meanwhile, since no electric field is applied between the second flexible electrode layer 3 and the third flexible electrode layer 5, and between the first flexible electrode layer 1 and the second flexible electrode layer 2, the electro-variable stiffness layer 4 and the first electro-deformable layer 2 deform synergistically with the second electro-deformable layer 6. Subsequently, by applying an electric field between the second flexible electrode layer 3 and the third flexible electrode layer 5, the electro-variable stiffness layer 4 become more rigid. As a result, the actuator maintains a stable deformed state.

2. The electric controlled bi-directional bending actuator with deformability and stiffness tunable capacity according to claim 1, wherein the first electro-deformable layer 2 and the second electro-deformable layer 6 are made from silicone rubber, polyurethane, acrylic ester, fluorinated silicone rubber or silicone rubber filled with TiO2 nanoparticles.

Compared with the previous reported techniques, the present invention has several features and advantages. The electric controlled bi-directional bending actuator with deformability and stiffness tunable capacity realizes the dual functions of deformation and variable stiffness through electric field adjustment. It has such merits as simple structure, precise regulation, quick response, convenient control and insensitive to environmental.

As shown in the above figures, 1 is the upper flexible electrode, 2 is the first electro-deformable layer, 3 is the second flexible electrode, 4 is the electro-variable stiffness layer, 5 is the third flexible electrode, 6 is the second electro-deformable layer, and 7 the fourth flexible electrode.

DETAILED DESCRIPTION

The specific embodiments of the present invention are further described below in conjunction with the drawings and technical solutions.

Figure 1:
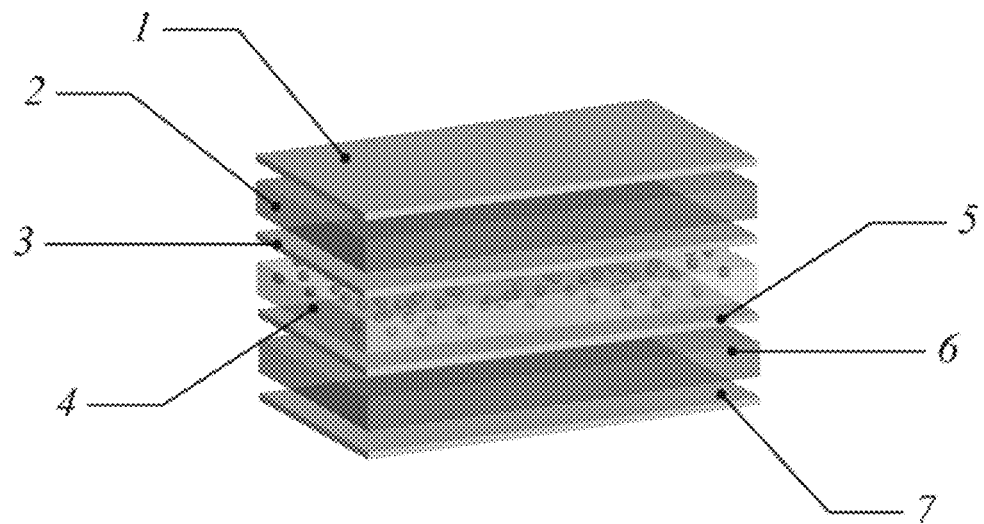
FIG. 1 is the schematic diagram of the structure of the electric controlled bi-directional bending actuator with deformability and stiffness tunable capacity proposed in the invention.

As shown in FIG. 1, the electric controlled bi-directional bending actuator with deformability and stiffness tunable capacity comprises electro-deformable layers, electro-variable stiffness layers and flexible electrodes.

The electric controlled bi-directional bending actuator with deformability and stiffness tunable capacity has seven layers; from up to bottom, they are the first flexible electrodes layer 1, the first electro-deformable layer 2, the second flexible electrodes layer 3, an electro-variable stiffness layer 4, the third flexible electrode layer 5, the second electro-deformable layer 6 and the fourth flexible electrode layer 7. The adjacent layers are glued together.

The first flexible electrode layer 1, the second flexible electrode layer 3, the third flexible electrode layer 5 and the fourth flexible electrode layer 7 are made of coating carbon paste, conductive polymer, conductive hydrogel or conductive silver paste;

The first electro-deformable layer 2 and the second electro-deformable layer 6 are made of dielectric elastomers.

The electro-variable stiffness layer 4 is made of electro-rheological fluids, electro-rheological gels or electro-rheological elastomers. The electrorheological fluids is a mixture of nano-sized dielectric particles and insulating oils, and the volume ratio of the former to the later is 1:9~3:2. The electrorheological gels is a mixture of nano-sized dielectric particles and hydrogels, and the volume ratio of the former to the later is 1:9~3:2. The electrorheological elastomer is a mixture of nano-sized dielectric particles and rubber, and the volume ratio of the former to the later is 1:9~3:2.

Figure 2:
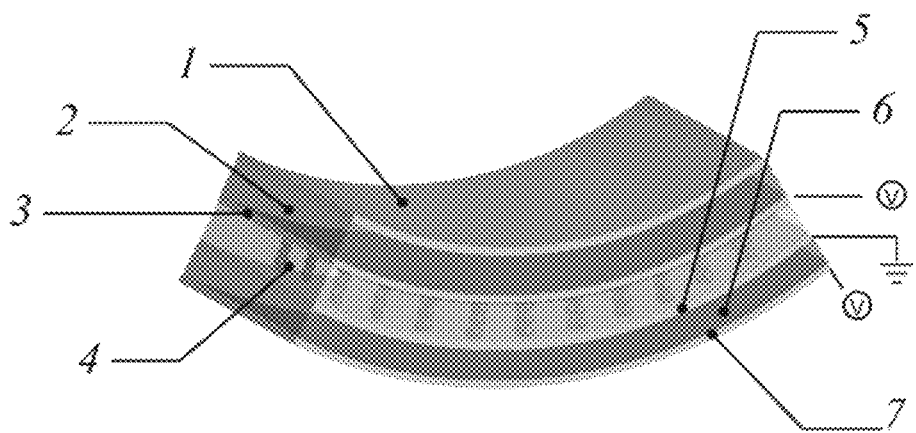
FIG. 2 is the schematic diagram of the mechanism of the upward deformation-variable stiffness of the electric controlled bi-directional bending actuator with deformability and stiffness tunable capacity proposed in the invention.

As shown in FIG. 2, the implementation process of the upward deformation-variable stiffness of the electric controlled bi-directional bending actuator with deformability and stiffness tunable capacity is described as following: by applying an electric field between the first flexible electrode layer 1 and the second flexible electrode layer 3, the first electro-deformable layer 2 deform due to the Maxwell effect, leading the actuator bends to one side. Meanwhile, since no electric field is applied between the second flexible electrode layer 3 and the third flexible electrode layer 5, and between the third flexible electrode layer 5 and the fourth flexible electrode layer 7, the electro-variable stiffness layer 4 and the second electro-deformable layer 6 deform synergistically with the first electro-deformable layer 2. Subsequently, by applying an electric field between the second flexible electrode layer 3 and the third flexible electrode layer 5, the electro-variable stiffness layer 4 become more rigid. As a result, the actuator maintains a stable deformed state.

Figure 3:
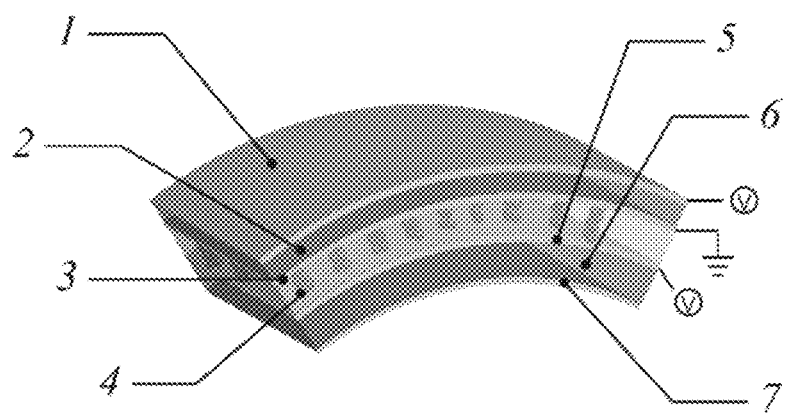
FIG. 3 is the schematic diagram of the mechanism of the downward deformation-variable stiffness of the electric controlled bi-directional bending actuator with deformability and stiffness tunable capacity proposed in the invention.

As shown in FIG. 3, the implementation process of the downward deformation-variable stiffness of the electric controlled bi-directional bending actuator with deformability and stiffness tunable capacity is described as following: by applying an electric field between the third flexible electrode layer 5 and the fourth flexible electrode layer 7, the second electro-deformable layer 6 deforms due to the Maxwell effect, leading the actuator bends to another side. Meanwhile, since no electric field is applied between the second flexible electrode layer 3 and the third flexible electrode layer 5, and between the first flexible electrode layer 1 and the second flexible electrode layer 2, the electro-variable stiffness layer 4 and the first electro-deformable layer 2 deform synergistically with the second electro-deformable layer 6. Subsequently, by applying an electric field between the second flexible electrode layer 3 and the third flexible electrode layer 5, the electro-variable stiffness layer 4 become more rigid. As a result, the actuator maintains a stable deformed state.

The invention claimed is:

1. An electric controlled bi-directional bending actuator with deformability and stiffness tunable capacity, comprising electro-deformable layers, electro-variable stiffness layers and flexible electrodes;

the electric controlled bi-directional bending actuator with deformability and stiffness tunable capacity has seven layers; from up to bottom, they are first flexible electrodes layer (1), first electro-deformable layer (2), second flexible electrodes layer (3), an electro-variable stiffness layer (4), third flexible electrode layer (5), second electro-deformable layer (6) and fourth flexible electrode layer (7); the adjacent layers are glued together;

the first flexible electrode layer (1), the second flexible electrode layer (3), the third flexible electrode layer (5) and the fourth flexible electrode layer (7) are made of coating carbon paste, conductive polymer, conductive hydrogel or conductive silver paste;

the first electro-deformable layer (2) and the second electro-deformable layer (6) are made of dielectric elastomers;

the electro-variable stiffness layer (4) is made of electro-rheological fluids, electro-rheological gels or electro-rheological elastomers; the electrorheological fluids is a mixture of nano-sized dielectric particles and insulating oils, and the volume ratio of the former to the later is 1:9~3:2; the electrorheological gels is a mixture of nano-sized dielectric particles and hydrogels, and the volume ratio of the former to the later is 1:9~3:2; the electrorheological elastomer is a mixture of nano-sized dielectric particles and rubber, and the volume ratio of the former to the later is 1:9~3:2;

when an electric field is applied between the first flexible electrode layer (1) and the second flexible electrode layer (3), the first electro-deformable layer (2) will deform due to the Maxwell effect, leading the actuator bends to one side; meanwhile, since no electric field is applied between the second flexible electrode layer (3) and the third flexible electrode layer (5), and between the third flexible electrode layer (5) and the fourth flexible electrode layer (7), the electro-variable stiffness layer (4) and the second electro-deformable layer (6) deform synergistically with the first electro-deformable layer (2); subsequently, by applying an electric field between the second flexible electrode layer (3) and the third flexible electrode layer (5), the electro-variable stiffness layer (4) become more rigid; as a result, the actuator maintains a stable deformed state;

on the contrary, when an electric field is applied between the third flexible electrode layer (5) and the fourth flexible electrode layer (7), the second electro-deformable layer (6) will deform due to the Maxwell effect, leading the actuator bends to another side; meanwhile, since no electric field is applied between the second flexible electrode layer (3) and the third flexible electrode layer (5), and between the first flexible electrode layer (1) and the second flexible electrode layer (2), the electro-variable stiffness layer (4) and the first electro-deformable layer (2) deform synergistically with the second electro-deformable layer (6); subsequently, by applying an electric field between the second flexible electrode layer (3) and the third flexible electrode layer (5), the electro-variable stiffness layer (4) become more rigid; as a result, the actuator maintains a stable deformed state.

2. The electric controlled bi-directional bending actuator with deformability and stiffness tunable capacity according to claim 1, wherein the first electro-deformable layer (2) and the second electro-deformable layer (6) are made from silicone rubber, polyurethane, acrylic ester, fluorinated silicone rubber or silicone rubber filled with TiO2 nanoparticles.

* * * * *